United States Patent
Tao et al.

(10) Patent No.: US 7,884,504 B2
(45) Date of Patent: Feb. 8, 2011

(54) TRANSMISSION LINE BASED HIGH VOLTAGE PULSE GENERATOR

(75) Inventors: Fengfeng Tao, Clifton Park, NY (US); Frank Jakob John Mueller, Glenville, NY (US); Robert Carl Murray, Rotterdam, NY (US); Seyed Gholamali Saddoughi, Clifton Park, NY (US); Abdelkrim Younsi, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 375 days.

(21) Appl. No.: 12/074,447

(22) Filed: Mar. 3, 2008

(65) Prior Publication Data

US 2009/0219071 A1  Sep. 3, 2009

(51) Int. Cl.
*H03K 12/00* (2006.01)

(52) U.S. Cl. ..................... 307/106; 307/147

(58) Field of Classification Search ......... 307/106–108, 307/147
See application file for complete search history.

(56) References Cited

U.S. PATENT DOCUMENTS

| | | | |
|---|---|---|---|
| 4,536,723 A * | 8/1985 | Lang et al. ............ | 307/106 |
| 5,138,270 A * | 8/1992 | Nakata et al. ............ | 307/106 |
| 6,066,901 A * | 5/2000 | Burkhart et al. ............ | 307/106 |
| 6,756,874 B2 * | 6/2004 | Buckles et al. ............ | 336/180 |

OTHER PUBLICATIONS

Liu, Z.; Pemen, A.J.M.; Winands, G.J.J.; Van Heesch, E.J.M.; Yan, K., "Development of a heavy duty pulsed power generator with ten spark gap switches", Pulsed Power Conference, 2007, 17th IEEE International, vol. 1, pp. 451-454, Jun. 17-22, 2007

Jian Qiu; Kefu Liu; Yifan Wu, "A Pulsed Power Supply Based on Power Semiconductor Switches and Transmission Line Transformer", Dielectrics and Electrical Insulation, IEEE Transaction on, vol. 14, No. 4, pp. 927-930, Aug. 2007.

Pawelek, D.B.; Wouters, P.A.A.; Pemen, A.J.M.; Kemper, A.H.; Brussaard, G.J.H., "Design of a Compact Transmission Line Transformer for High Voltage Nanosecond Pulses", Dielectrics and Eletrical Insulation, IEEE Transactions on, vol. 14, No. 4, pp. 900-906, Aug. 2007.

Kjain, K.; Smith, P.W., "Rast Rise-Time Pulse Transformers Based on Transmission Line Transformer Like Structures", Pulsed Power Conference, 2005 IEEE, vol., no., pp. 779-782, Jun. 13-17, 2005.

Luo, J.; Istenic, M.; Novac, B.M.; Smith, I.R.; Brown, J., "Design of 500 kV pulse transformers using magnetic insulation", Pulsed Power Symposium, 2005, the IEE (Reg. No. 2005/10070), vol., no., pp. 17/1-17-4, Sep. 8.

(Continued)

*Primary Examiner*—Fritz M Fleming
(74) *Attorney, Agent, or Firm*—Francis T. Coppa

(57) ABSTRACT

A high voltage, fast pulse rise/fall time, and high repetition rate pulse generator solves the high pulse repetition rate limitations associated with RF power amplifiers and gap switch type pulse generators. The pulse generator employs a transmission line architecture and structural techniques that allow for continued high voltage, fast rise/fall time, and high repetition pulse rate operation of the pulse generator without impairment of the pulse generator while exceeding performance characteristics achievable with conventional RF power amplifiers and gap switch type pulse generators.

21 Claims, 3 Drawing Sheets

OTHER PUBLICATIONS

Behrend, M.; Kuthi, A.; Gundersen, M., "Solid state stepped transmission line transformer for spark gap triggering", Pulsed Power Conference, 2003, digest of Technical Papers, PPC-2003, 14th IEEE International, vol. 2, no., pp. 953-956, vol. 2, Jun. 15-18, 2003.

Yan, K.; Van Heesch, E.J.M.; Wouters, P.A.A.F.; Pemen, A.J.M.; Nair, S.A., "Transmission line transformers for up to 100 kW pulsed power generation", Power Modulator Symposium, 2002 and 2002 High-Voltage workshop.

Graneau, P.N.; Rossi, J.O.; Brown, M.P.; Smith, P.W., "A high-voltage transmission-line pulse transformer with very low droop", Review of Scientific Instruments, vol. 67, No. 7, pp. 2630-2635, Jul. 1996, doi: 10.1063/1.1147179.

Wilson, C.R.; Erickson, G.A.; Smith, P.W., "Compact, repetitive, pulsed power generators based on transmission line transformers", Pulsed Power Conference, 1989, 7th, pp. 108-112.

Ibuka, S.; Ohnishi, M.; Yamada, T.; Yasuoka, K.; Ishil, S.; Kwang-Cheol Ko, "Voltage amplification effect of nonlinear transmission lines for fast high voltage pulse generation", Pulsed Power Conference, 1997, digest of Technical Papers, 1997 11th IEEE International, vol. 2, no., pp. 1548-1553, vol. 2, Jun. 29-Jul. 2, 1997.

Rossi, J.O., "Low frequency operation of transmission line transformers", Pulsed Power Conference, 1999, Digest of Technical Papers, 12th IEEE International, vol. 2, no., pp. 1464-1467, vol. 2, 1999.

* cited by examiner

US 7,884,504 B2

TRANSMISSION LINE BASED HIGH VOLTAGE PULSE GENERATOR

BACKGROUND

The invention relates generally to electronic power conversion and more particularly to a solid state high voltage, fast rise/fall time, and high pulse repetition rate pulse generator using a transmission line transformer.

Plasma generators capable of operating at high voltages with fast pulse rise and fall times, and high pulse repetition rates have generally employed radio frequency (RF) power amplifiers and related technology to accomplish high voltage, high speed and high pulse repetition rate generation and transmission. Such RF power amplifiers are expensive to produce and suffer in reliability due to internal heat build-up during high pulse repetition rate generation. RF amplifiers also undesirably require significant real estate and generally have low electric efficiency. Further, RF power amplifier technology is not particularly suitable for generation of high pulse repetition rates due to thermal losses, among other things.

Known high voltage pulse generators for the generation of plasma and the like generally employ gap type switches that substantially limit the upper pulse repetition rate as well as the overall system reliability level. These known high voltage pulse generation systems also require a substantial amount of real estate to provide a working system due to structural limitations.

It would be both advantageous and beneficial to provide a high voltage, fast rise/fall time, high pulse repetition rate pulse generator that overcomes the high pulse repetition rate limitations associated with conventional high voltage pulse generators. It would be further advantageous if the high voltage, fast rise/fall time, high pulse repetition rate pulse generator were capable of continued operation without impairment of the pulse generator during substantially longer time periods than that achievable using conventional high voltage pulse generators. It would be further advantageous if the high voltage, fast rise/fall time, high pulse repetition rate pulse generator occupied substantially less real estate to provide a working system than that required by conventional high voltage pulse generators.

BRIEF DESCRIPTION

Briefly, in accordance with one embodiment, a pulse generator for generating high voltage, fast rise/fall time, high repetition rate pulses comprises:

a plurality of pulse forming modules, each module comprising a solid-state switch; and a transmission line transformer configured to generate high voltage, fast rise/fall time, high repetition rate pulses in response to voltage pulses generated via the plurality of pulse forming modules.

According to another embodiment, a system for generating high voltage, fast rise/fall time, high repetition rate pulses comprises:

a plurality of solid-state switches;

a pulse forming line corresponding to each solid-state switch, each pulse forming line configured to generate a high fast rise/fall time, high repetition rate voltage pulse simultaneously with each other in response to operation of its corresponding solid-state switch; and a transmission line transformer configured to generate high voltage, fast rise/fall time, high repetition rate pulses in response to the voltage pulses generated via the pulse forming lines.

According to yet another embodiment, a plasma pulse generation system comprises:

a plurality of solid-state switching pulse forming modules; and a transmission line transformer configured to generate high voltage, fast rise/fall time, high repetition rate output pulses for the generation of plasma in response to input voltage pulses generated via the plurality of pulse forming modules.

DRAWINGS

These and other features, aspects, and advantages of the present invention will become better understood when the following detailed description is read with reference to the accompanying drawings in which like characters represent like parts throughout the drawings, wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

Figure 1:
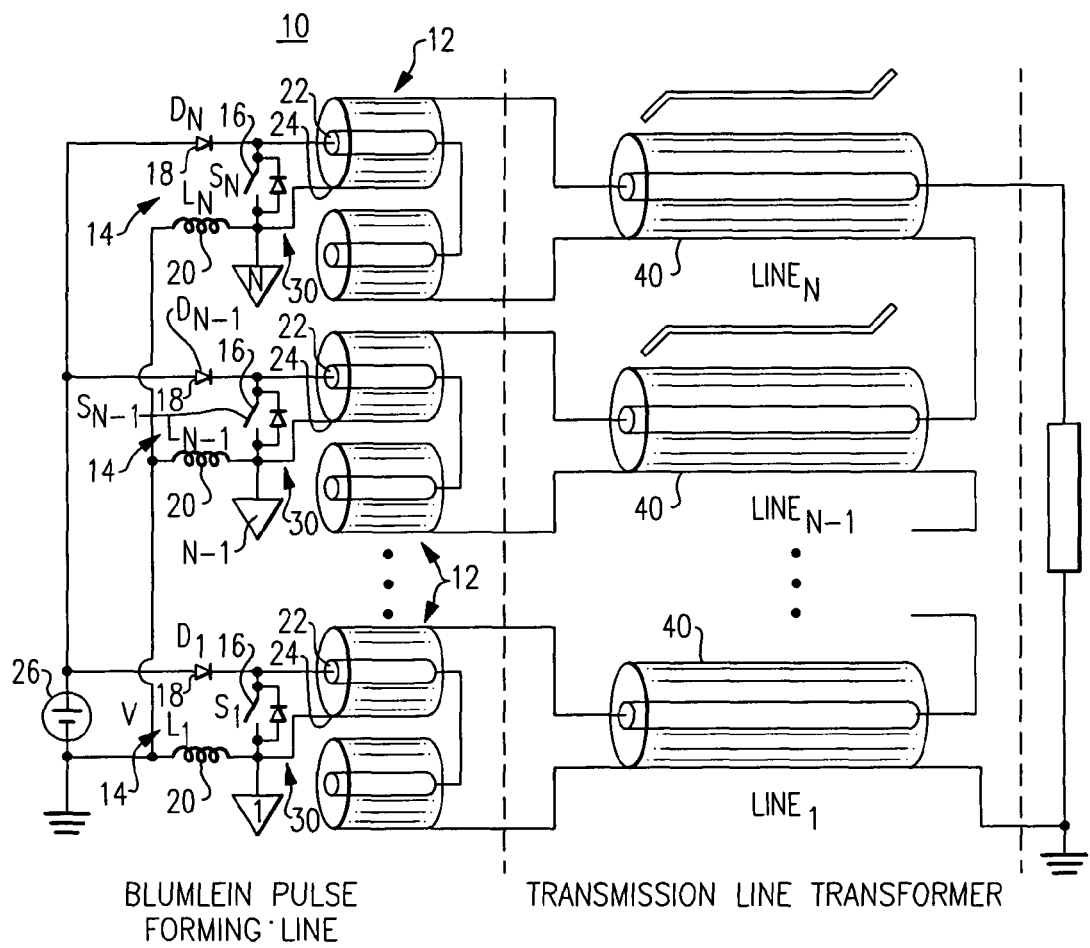
FIG. 1 is a system diagram illustrating a high voltage, fast rise/fall time, high repetition rate pulse generator according to one embodiment of the invention.

FIG. 1 is a system diagram illustrating a high voltage, fast rise/fall time, high repetition rate pulse generator 10 according to one embodiment of the invention. As used herein, high speed means pulses having a fast rise time and a fast fall time. Pulse generator 10 comprises a plurality of Blumlein pulse forming lines 12. Each Blumlein pulse forming line 12 is driven via a switching/pulse charging circuit 14 comprising a high voltage solid state switch 16 such as, for example, a high voltage switching MOSFET to form a pulse forming module 30. Pulse generator 10 can be seen to comprise a plurality of such pulse forming modules 30. These pulse forming modules 30 are substantially identical to one another according to one embodiment of the invention.

Pulse generator 10 also comprises a transmission line transformer 40 that is configured within pulse generator 10 to multiply input voltage pulses generated via the plurality of Blumlein pulse forming lines 12 into high voltage pulses without degradation of pulse rise and fall times. Because the Blumlein pulse forming lines 12 are driven by solid state switches 16, pulse generator 10 advantageously generates high voltage, high speed pulses at a much higher repetition rate and with higher pulse rise and falls times and higher pulse voltage magnitudes than can be achieved when using conventional gap switch pulse generators commonly employed in the prior art. One workable embodiment was found to achieve a pulse repetition rate exceeding 100 kpps, a pulse rise/fall time of about 10 nanoseconds, a high voltage magnitude of at least 30 kV, and a pulse width of about 20 nanoseconds.

The use of solid state based switches 16 further advantageously allows pulse generator 10 to be constructed in a manner that is substantially smaller, substantially more efficient, and substantially more reliable than conventional gap switch pulse generators commonly employed in the prior art.

With continued reference to FIG. 1, each switching/pulse charging circuit 14 further comprises a diode 18 and an inductor 20. A switching operation of each switch 16 causes each corresponding inductor 20 to develop a differential pulse voltage and also provides high frequency isolation between switch 16 ground connections and the inner conductor 22 and outer shield 24 of each corresponding Blumlein pulse forming line 12 as a DC voltage source 26 is switched on and off. Because each Blumlein pulse forming line comprises distributed capacitance characteristics, a differential voltage having a magnitude approximately twice the DC input voltage 26 level is stored across this Blumlein pulse forming line distributed capacitance during each switching cycle. Diode 18 operates to prevent undesired backcharging of the pulse voltage during the switching cycle, allowing creation of the desired pulse voltage signal.

Each line of the transmission line transformer 40 and each of the Blumlein pulse forming lines 12 are constructed of the same type of coaxial cable according to one embodiment of the invention. The transmission line transformer 40, according to one embodiment, is configured generate a high voltage, high speed, high repetition rate voltage pulse having a magnitude equivalent to the total number N of pulse forming modules 30 times the magnitude of a voltage pulse generated via a single pulse forming module 30.

The high voltage, high speed, high repetition rate pulse generator 10 offers several advantages over the conventional gap switch pulse generators that are known in the art. Some of these advantages include 1) the use of modular design providing ease of manufacture and high reliability, 2) substantially perfect matching between the Blumlein pulse forming line and its corresponding transmission line transformer for high efficiency, 3) the capability of using different length lines to construct the transmission line transformer, 4) propagation time delays that can be easily compensated by switch gate signals, 5) configuration of switches that each drive a pair of lines forming a floating transmission line, 6) switch ground connections that are isolated with chokes/inductors, 7) a high efficiency topology in which very minimal energy is wasted within the structure of the transmission line transformer itself, 8) superior current sharing features, 9) switching speeds determined only by transmission line and solid-state switch characteristics, 10) compact topology requiring minimal real-estate, 11) a voltage pulse amplitude that is proportional to an input voltage amplitude, and 12) a pulse repetition rate that is limited only by magnetic material and charging circuit characteristics.

Figure 2:
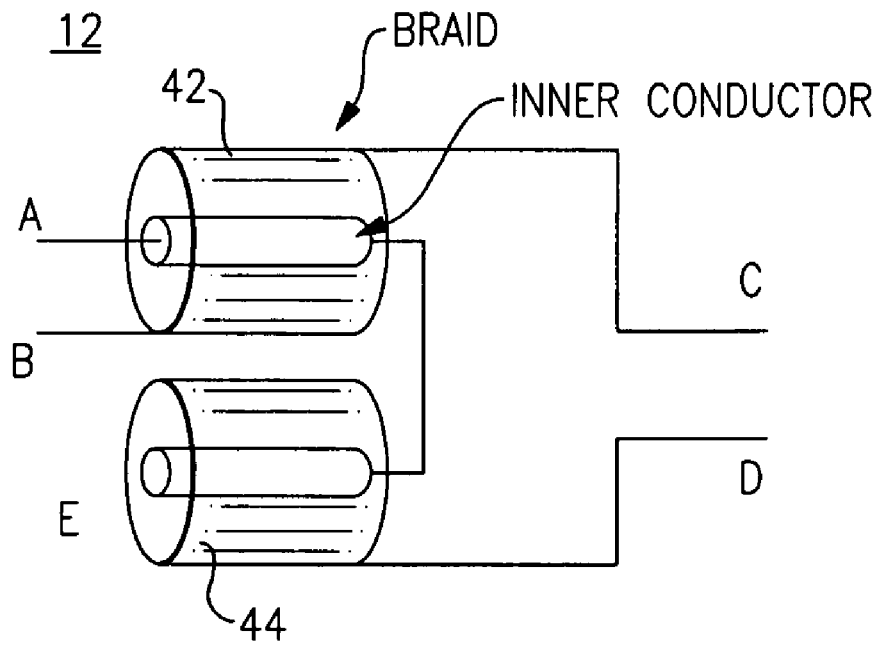
FIG. 2 illustrates one of the Blumlein pulse forming lines depicted in FIG. 1 modified with alphabetical characters representing different parts of the Blumlein pulse forming line.
Figure 3:
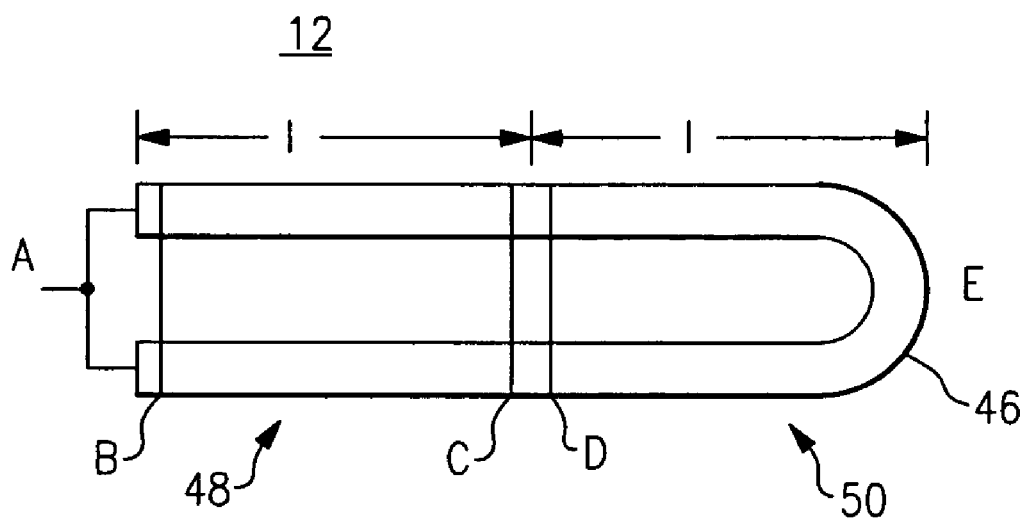
FIG. 3 is a diagram illustrating construction of a Blumlein pulse forming line according to one embodiment of the invention.

FIGS. 2 and 3 together illustrate construction of a Blumlein pulse forming line 12 according to one embodiment of the invention. FIG. 2 depicts a single Blumlein pulse forming line 12 as also depicted in each pulse forming module 30 of FIG. 1. Blumlein pulse forming line 12 is represented in FIG. 2 as a pair of coaxial transmission line elements 42, 44, each having an inner conductor 22 and an outer shield 24 encapsulating the inner conductor 22 along the entire length of the corresponding coaxial line 42, 44. A signal input end of coaxial line 42 is represented as 'A', while a corresponding open circuit end of coaxial line 44 is represented as 'E'. Inner conductor 22 of coaxial line 42 is shorted to inner conductor 22 of coaxial line 44. The shield 24 of coaxial line 42 is represented as 'B' at the signal input end of coaxial line 42. The outer shield 24 of coaxial line 42 is represented as signal output node 'C' at the end opposite the signal input end 'A' of coaxial line 42; while the outer shield 24 of coaxial line 44 is represented as signal output node 'D' at the end opposite the open circuit end 'E' of coaxial line 44.

FIG. 3 is a diagram illustrating the physical construction of a Blumlein pulse forming line 12 suitable for use in the pulse generator 10 depicted in FIG. 1, according to one embodiment of the invention. Blumlein pulse forming line 12 comprises a single length of coaxial type transmission cable 46 that is formed into a U-shape transmission element. The single inner conductor 22 is shorted together at its exposed ends represented as 'A' which corresponds to the shorted inner conductors depicted in FIG. 2. The outer shield 24 of the U-shape transmission element is separated at the center, along the straight portions of the U-shape transmission element such that the U-shape transmission element is characterized by two sub-elements 48, 50. The first transmission sub-element 48 comprises the two straight portions, each having a length 'L', and having the outer shield of each portion shorted together at the point of separation, as depicted in FIG. 3. The second transmission sub-element 50 comprises the remaining U-shape portion, having its outer shield shorted together at the point of separation, as also depicted in FIG. 3. This physical Blumlein pulse forming line 12 then has one input 'A' that corresponds with the conductor 22 input 'A' depicted in FIGS. 2 and 3, and another input 'B' that corresponds with the outer shield 24 input 'B' depicted in FIGS. 1 and 2. The first transmission sub-element 48 has a first output 'C' at the point where the outer shields are shorted together, corresponding with output 'C' in FIG. 2. The second transmission sub-element 50 has a second output 'D' at the point where the ends of the outer shield are shorted together, corresponding with output 'D' in FIG. 2. The U-shape portion 'E' of transmission sub-element 50 corresponds with the open circuit end 'E' in FIG. 2.

Blumlein pulse forming line 12 advantageously provides excellent impedance matching characteristics when it comprises the same type of transmission lines, i.e. coaxial cable, as the transmission line transformer 40. The physical construction of a Blumlein pulse forming line 12 described above with reference to FIG. 3 also advantageously has a minimal number of high voltage joints, a feature that reduces occurrences of undesirable corona discharge.

Figure 4:
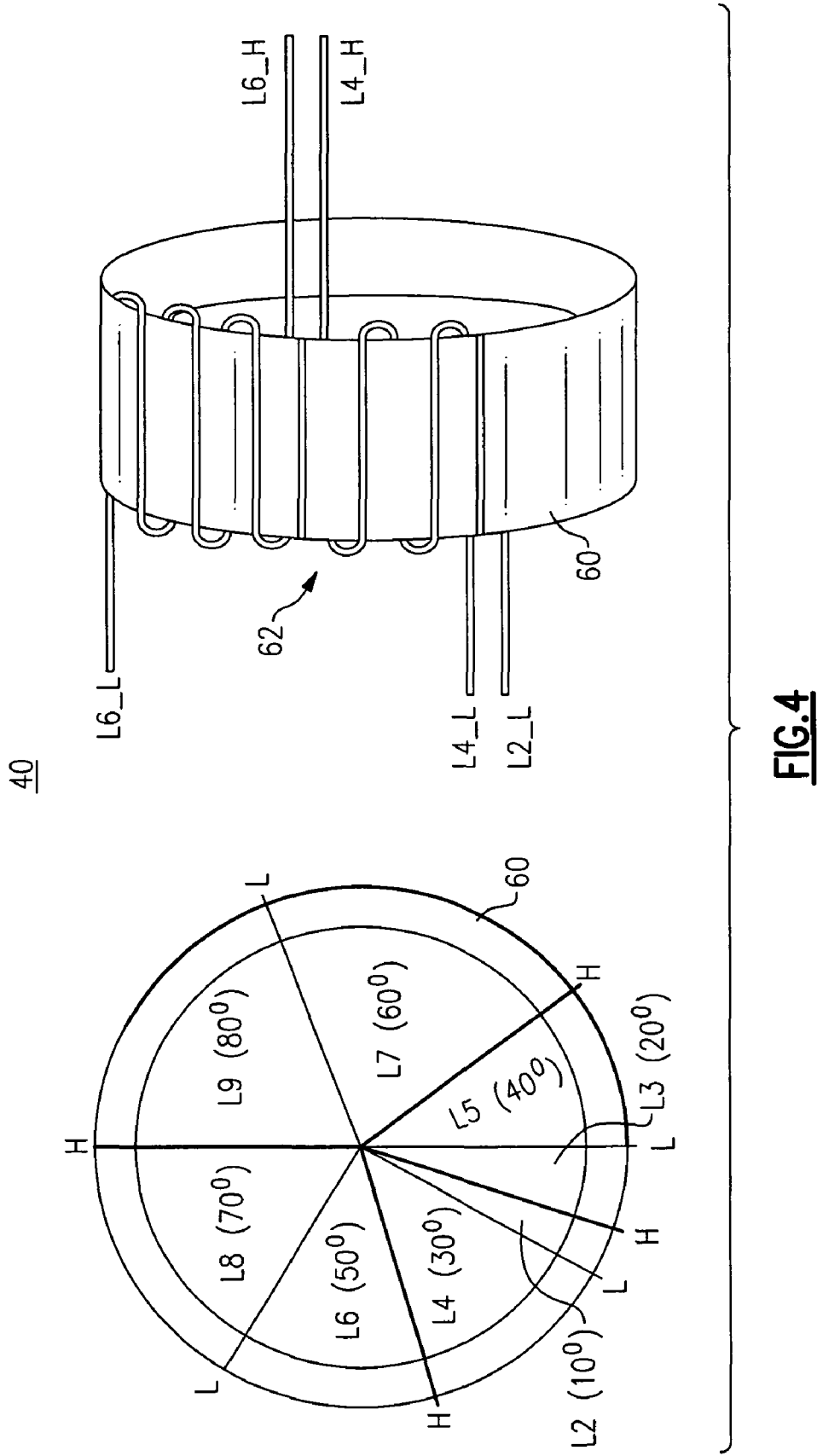
FIG. 4 is a diagram illustrating construction of a transmission line transformer according to one embodiment of the invention.

FIG. 4 is a diagram illustrating the physical construction of a transmission line transformer 40 that advantageously functions in a manner that substantially eliminates undesired parasitic/secondary or common mode propagation errors according to one embodiment of the invention. The left portion of FIG. 4 depicts an axial view of the transmission line transformer 40, while the right portion of FIG. 4 depicts a perspective view of the transmission line transformer 40. Transmission line transformer 40 includes a high-mu magnetic core 60 according to one embodiment. Each individual transformer 40 transmission line L1-Ln is wound around the magnetic core 60 to form a torroid 62 in accordance with a suitable construction rule. Line L1, for example, can pass straight through the magnetic core 60 without being wound around the core 60. Line L2, for example, can be wound around the magnetic core 60 once to form a single turn of the torroid 52. Line L3, for example, can be wound around the magnetic core 60 twice to form two turns of the torroid 62, and so on. Table 1 below illustrates a winding rule according to one embodiment that was found suitable by the present inventors to provide desired working results.

TABLE 1

Torroid Winding Rule

| | Turns | Θ |
|---|---|---|
| L1 | 0 | 0 |
| L2 | 1 * m, where m is an integer | 4 * 180°/[m(n − 1)], where n is an integer |
| ... | ... | ... |
| Lj, where j is an integer | (j − 1) * m | 4 * 180°(j − 1)/[m(n − 1)] |
| ... | ... | ... |
| Ln | n * m | 4 * 180°/n |
| Σ | n(n − 1)m/2 | 360° |

The inputs of the lines L1-Ln are separated to minimize parasitic coupling while the tails are in close proximity to allow easy interconnection according to one embodiment. According to one aspect of the invention, the length of each of the lines L1-Ln are kept as small as practical to minimize line losses. According to another aspect of the invention, each of the lines L1-Ln are tightly wound on a high-mu core 60 such that each loop is guaranteed to have substantially the same voltage drop.

A significant advantage provided by the pulse generator 10 using the foregoing torroidal construction techniques is the capability to calibrate gate drive signals to the solid-state switches 16 in a manner that ensures that every pulse generated by the pulse generator 10 arrives at the output/load at substantially the same point in time. Another significant advantage provided by the foregoing torroidal construction techniques is the increased capability to preserve the integrity of the pulses generated by the pulse generator 10.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A pulse generator comprising:
  a plurality of pulse forming modules, each module comprising a solid-state switch and further comprising a single length of coaxial type transmission cable configured as a Blumlein pulse forming line, wherein the single length of coaxial type transmission cable inner conductor is shorted together at its exposed ends; and
  a transmission line transformer configured together with the plurality of pulse forming modules to generate high voltage, fast rise/fall time, high repetition rate pulses in response to voltage pulses generated via the plurality of pulse forming modules, the transmission line transformer comprising a plurality of coaxial type transmission cables wound together on a common magnetic core to form a torroid, each transmission line transformer cable comprising a different number of torroidal turns relative to the other transmission line transformer cable torroidal turns.

2. The pulse generator according to claim 1, wherein the Blumlein coaxial transmission cable is configured in a U-shape with its outer shield split into two sections, and further wherein the coaxial transmission cable has its inner conductor and its outer shield sections connected to create an equivalent coaxial cable transmission pair in a parallel arrangement.

3. The pulse generator according to claim 1, wherein each pulse forming module further comprises:
  a diode; and
  an inductor configured in combination with the diode and the solid-state switch to generate a differential voltage pulse having a magnitude approximately twice the magnitude of a DC input voltage, the inductor further configured to provide isolation between the solid-state switch and a DC voltage source ground.

4. The pulse generator according to claim 1, wherein the magnetic core comprises a high-mu magnetic core.

5. The pulse generator according to claim 4, wherein the plurality of solid-state switches are configured to switch at different points in time such that a high voltage, fast rise/fall time, high repetition rate voltage pulse generated via each transmission line transformer coaxial transmission cable arrives at a pulse generator output at substantially the same point in time.

6. The pulse generator according to claim 4, wherein the inputs of the plurality of transmission line transformer coaxial transmission cables are separated to minimize parasitic coupling while the tails of the plurality of transmission line transformer coaxial transmission cables are in close proximity to allow easy interconnection.

7. The pulse generator according to claim 1, wherein the transmission line transformer together with the plurality of pulse forming modules is configured to generate high voltage, fast rise/fall time pulses at a pulse rate ranging from about 1 pulse-per-second to at least 100 kilo pulses-per-second at a voltage level up to about 30 kV.

8. A pulse generating system comprising:
  a plurality of solid-state switches;
  a pulse forming line corresponding to each solid-state switch, each pulse forming line comprising a single length of coaxial type transmission cable configured as a Blumlein pulse forming line, wherein the single length of coaxial type transmission cable inner conductor is shorted together at its exposed ends, the pulse forming line configured to generate a fast rise/fall time, high repetition rate voltage pulse in response to operation of its corresponding solid-state switch; and
  a transmission line transformer configured to generate high voltage, fast rise/fall time, high repetition rate pulses in response to combined voltage pulses generated via the pulse forming lines, the transmission line transformer comprising a plurality of coaxial type transmission cables wound together on a common magnetic core to form a torroid each transmission line transformer cable comprising a different number of torroidal turns relative to the other transmission line transformer cable torroidal turns.

9. The pulse generating system according to claim 8, wherein each pulse forming line in combination with its corresponding solid-state switch is configured as a pulse forming module.

10. The pulse generating system according to claim 9, wherein each pulse forming module further comprises:
  a diode; and
  an inductor configured in combination with the diode and its corresponding solid-state switch to generate a differential voltage pulse having a magnitude approximately twice the magnitude of a DC input voltage, the inductor further configured to provide isolation between the corresponding solid-state switch and a DC voltage source ground.

11. The pulse generating system according to claim 8, wherein the magnetic core comprises a high-mu magnetic core.

12. The pulse generating system according to claim 8, wherein the high voltage, fast rise/fall time, high repetition rate pulses have a maximum voltage magnitude of about 30 kV at a desired pulse repetition rate from about 1 pulse-per-second (pps) to about 100 kpps.

13. The pulse generating system according to claim 8, wherein the plurality of solid-state switches are configured to switch at different points in time such that the high voltage, fast rise/fall time, high repetition rate pulses generated via the transmission line transformer are generated in unison.

14. A plasma pulse generation system comprising:
   a plurality of solid-state switching pulse forming modules, each module comprising a single length of coaxial type transmission cable configured as a Blumlein pulse forming line, wherein the single length of coaxial type transmission cable inner conductor is shorted together at its exposed ends; and
   a transmission line transformer configured to generate high voltage, fast rise/fall time, high repetition rate output pulses having sufficient pulse characteristics for the generation of plasma in response to input voltage pulses generated via the plurality of pulse forming modules, the transmission line transformer comprising a plurality of coaxial type transmission cables wound together on a common magnetic core to form a torroid, each transmission line transformer cable comprising a different number of torroidal turns relative to the other transmission line transformer cable torroidal turns.

15. The plasma pulse generation system according to claim 14, wherein each coaxial transmission cable is configured in a U-shape with its outer shield split into two sections, and further wherein the coaxial transmission cable has its inner conductor and its outer shield sections connected to create an equivalent coaxial cable transmission pair in a parallel arrangement.

16. The plasma pulse generation system according to claim 14, wherein each pulse forming module further comprises a solid-state switch configured to drive its corresponding pulse forming line such that the high voltage, fast rise/fall time, high repetition rate output pulses are generated in unison.

17. The plasma pulse generation system according to claim 16, wherein each pulse forming module further comprises:
   a diode; and
   an inductor configured in combination with the diode and its corresponding solid-state switch to generate a differential voltage pulse having a magnitude approximately twice the magnitude of a DC input voltage, the inductor further configured to provide isolation between the corresponding solid-state switch and a DC voltage source ground.

18. The plasma pulse generation system according to claim 14, wherein the magnetic core comprises a high-mu magnetic core.

19. The plasma pulse generation system according to claim 18, wherein the plurality of coaxial transmission cables comprise inputs separated to minimize parasitic coupling and tails in close proximity to allow easy interconnection.

20. The plasma pulse generation system according to claim 14, wherein the plurality of solid-state switching pulse forming modules are configured to switch at different points in time such that the input voltage pulse generated via each pulse forming module arrives at the transmission line transformer at a different point in time.

21. The plasma pulse generation system according to claim 14, wherein the transmission line transformer together with the plurality of pulse forming modules is configured to generate high voltage, fast rise/fall time, high repetition rate pulses at a pulse rate ranging from about 1 pulse-per-second to at least 100 kilo pulses-per-second at a voltage level up to about 30 kV.

* * * * *